United States Patent
Mokerji

(10) Patent No.: US 6,168,242 B1
(45) Date of Patent: *Jan. 2, 2001

(54) ZIRCONIUM NITRIDE COATING HAVING A TOP LAYER THEREON

(75) Inventor: Subrata Mokerji, Shelby Township, MI (US)

(73) Assignee: MascoTech, Inc., Taylor, MI (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/905,883

(22) Filed: Aug. 1, 1997

(51) Int. Cl.[7] ....................................................... B60B 7/00
(52) U.S. Cl. ..................... 301/37.1; 301/5.1; 301/37.42; 301/108.1; 428/412; 428/423.1; 428/425.9; 428/458; 428/462; 428/463
(58) Field of Search ..................... 301/5.1, 37.1, 301/37.42, 108.1; 428/412, 458, 462, 413, 423.1, 425.9

(56) References Cited

U.S. PATENT DOCUMENTS

| | | |
|---|---|---|
| 3,838,512 | 10/1974 | Sanderson . |
| 3,977,839 | 8/1976 | Palisin, Jr. . |
| 4,109,052 | 8/1978 | Anderson . |
| 4,148,967 | 4/1979 | Satoh et al. . |
| 4,226,082 * | 10/1980 | Nishida ................................ 428/927 |
| 4,256,346 * | 3/1981 | Kawaguchi et al. .................. 301/66 |
| 4,305,981 | 12/1981 | Muroi et al. . |
| 4,321,299 | 3/1982 | Frazer . |
| 4,369,225 | 1/1983 | Manabe et al. . |
| 4,374,717 | 2/1983 | Drauglis et al. . |
| 4,699,850 * | 10/1987 | Kishi et al. ........................... 428/469 |
| 4,911,811 | 3/1990 | Mullaney, Jr. . |
| 4,931,366 | 6/1990 | Mullaney, Jr. . |
| 5,510,164 | 4/1996 | Best et al. . |
| 5,589,280 | 12/1996 | Gibbons et al. . |
| 5,656,335 | 8/1997 | Schwing et al. . |

* cited by examiner

Primary Examiner—Archene Turner
(74) Attorney, Agent, or Firm—Myron B. Kapustij; Lloyd D. Doigan

(57) ABSTRACT

An article is coated with a multi-layer coating comprising a polymeric layer deposited on the surface of the article, a zirconium compound or titanium compound layer deposited on the polymeric layer, and a polyurethane layer deposited on the zirconium compound or titanium compound layer.

38 Claims, 1 Drawing Sheet

ZIRCONIUM NITRIDE COATING HAVING A TOP LAYER THEREON

FIELD OF THE INVENTION

The instant invention relates to a substrate having a leveling plastic coating thereon, a decorative zirconium nitride layer on the plastic coating, and a protective polyurethane coating over the zirconium nitride layer.

SUMMARY OF THE INVENTION

In accordance with this invention a plastic basecoat is provided on the surface of the substrate. The polymeric basecoat provides a leveling effect to the surface of the substrate. A decorative zirconium compound or titanium compound layer is then applied onto the basecoat. A protective polyurethane top coat is provided over the zirconium compound or titanium compound layer.

BACKGROUND OF THE INVENTION

Thin zirconium compound or titanium compound layers have been applied by vapor deposition onto the surfaces of various substrates to provide a decorative and shiny appearance thereto. However, the substrates have had to be pretreated as by drying, polishing, cleaning and the like to remove any stains, spots, scratches or other imperfections from their surfaces before the zirconium compound or titanium compound layer is applied thereon. Otherwise, the zirconium compound or titanium compound layer will enhance and accentuate these imperfections. Also, the zirconium compound or titanium compound layer, while quite hard, is nevertheless subject to abrasion, scratching and weathering, particularly if it is applied onto a part of a vehicle such as, for example, a wheel cover.

The present invention provides a substrate having a decorative zirconium compound or titanium compound layer which is not subject to the afore-mentioned disadvantages.

DESCRIPTION OF THE PREFERRED EMBODIMENT

Figure 1:
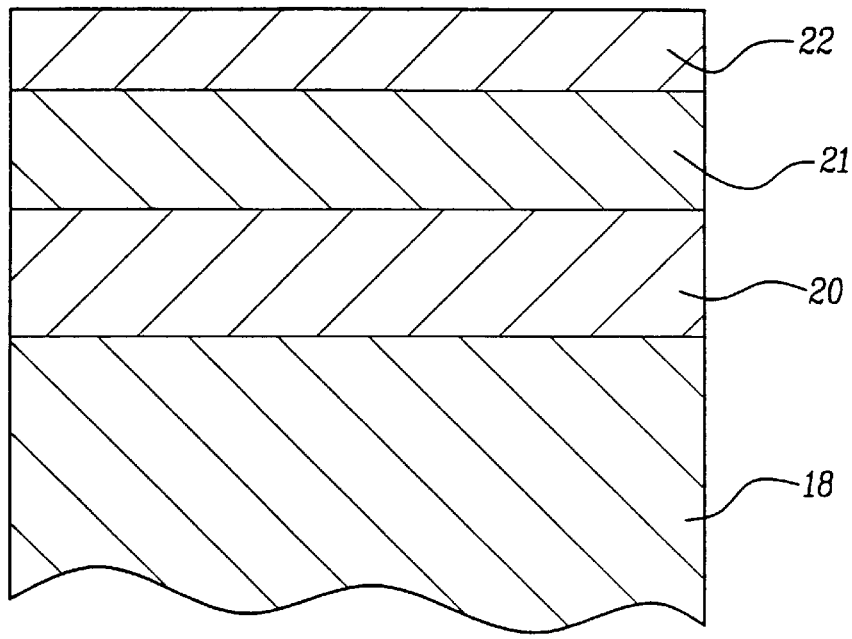
FIG. 1 is a cross-sectional view, not to scale, of a portion of the substrate having the multi-layer coating on its surface.

The article or substrate 18 can be comprised of any suitable material such as plastic, ceramic, metal or metal alloy. The metals include nickel, aluminum, copper, steel and zinc. The metal alloys include nickel alloys and brass. The plastics forming the substrate include polycarbonates, nylon, acrylonitrile-butadienestyrene, polyesters, polyvinylchlorides, and the like. In one embodiment the article is part of a vehicle, such as for example, a wheel cover.

Over the surface of the substrate 18 is deposited a polymeric or resinous layer 20. The polymeric or resinous layer or basecoat 20 may be comprised of both thermoplastic and thermoset polymeric or resinous material. These polymeric or resinous materials include the well known, conventional and commercially available polycarbonates, polyacrylates, polymethacrylates, nylons, polyesters, polypropylenes, polyepoxies, alkyds and styrene containing polymers such as polystyrene, styrene-acrylonitrile (SAN), styrene-butadiene, and acrylonitrile-butadiene-styrene (ABS), and blends or copolymers thereof.

The polycarbonates are described in U.S. Pat. Nos. 4,579,910 and 4,513,037, both of which are incorporated herein by reference.

Nylons are polyamides which can be prepared by the reaction of diamines with dicarboxylic acids. The diamines and dicarboxylic acids which are generally utilized in preparing nylons generally contain from two to about 12 carbon atoms. Nylons can also be prepared by additional polymerization. They are described in "Polyamide Resins", D. E. Floyd, Reinhold Publishing Corp., New York, 1958, which is incorporated herein by reference.

The polyepoxies are disclosed in "Epoxy Resins", by H. Lee and K. Neville, McGraw-Hill, New York, 1957, and in U.S. Pat. Nos. 2,633,458; 4,988,572; 4,680,076; 4,933,429 and 4,999,388, all of which are incorporated herein by reference.

The polyesters are polycondensation products of an aromatic dicarboxylic acid and a dihydric alcohol. The aromatic dicarboxylic acids include terephthalic acid, isophthalic acid, 4,4'-diphenyl-dicarboxylic acid, 2,6-naphthalenedicarboxylic acid, and the like. Dihydric alcohols include the lower alkane diols with from two to about 10 carbon atoms such as, for example, ethylene glycol, propylene glycol, cyclohexanedimethanol, and the like. Some illustrative non-limiting examples of polyesters include polyethylene terephthalate, polybutylene terephthalate, polyethylene isophthalate, and poly(1,4-cyclohexanedimethylene terephthalate). They are disclosed in U.S. Pat. Nos. 2,465,319; 2,901,466 and 3,047,539, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears herein. The polymerization of the monomeric acrylates and methacrylates to provide the polyacrylate resins useful in the practice of the invention may be accomplished by any of the well known polymerization techniques.

The styrene-acrylonitrile and acrylonitrile-butadiene-styrene resins and their preparation are disclosed, inter alia, in U.S. Pat. Nos. 2,769,804; 2,989,517; 2,739,142; 3,991,136 and 4,387,179, all of which are incorporated herein by reference.

The alkyd resins are disclosed in "Alkyd Resin Technology", Patton, Interscience Publishers, NY, N.Y., 1962, and in U.S. Pat. Nos. 3,102,866; 3,228,787 and 4,511,692, all of which are incorporated herein by reference.

These polymeric materials may optionally contain the conventional and well known fillers such as mica, talc and glass fibers.

The polymeric layer or basecoat 20 may be applied onto the surface of the substrate by any of the well known and conventional methods such as dipping, spraying and brushing.

The polymeric layer 20 functions, inter alia, to level the surface of the substrate, cover any scratches or imperfections in the surface and provide a smooth and even surface for the deposition of the chrome layer.

The polymeric layer 20 has a thickness at least effective to level out the surface of the substrate. Generally, this thickness is from about 0.1 mil to about 10 mils, preferably from about 0.2 mil to about 5 mils, and more preferably from about 0.3 mils to about 1.5 mils.

The zirconium compound, titanium compound or zirconium/titanium alloy compound layer 21 consists of the nitrides, oxides, carbides and carbonitrides, preferably the nitrides and carbonitrides, of zirconium, titanium or zirconium/titanium alloy. The more preferred zirconium compounds, titanium compounds and zirconium titanium alloy compounds are zirconium nitride, titanium nitride and zirconium/titanium alloy nitride. Also included within the scope of the term zirconium compound or titanium compound are compounds of alloys of zirconium and titanium. Thus, the preferred zirconium compound and titanium compound are zirconium nitride, zirconium carbonitride, titanium nitride, titanium carbonitride, zirconium/titanium alloy carbonitride, and zirconium/titanium alloy nitride, with the nitrides being more preferred.

The alloys of zirconium and titanium typically contain, in percent by weight, from about 10% titanium and 90% zirconium to about 90% titanium and 10% zirconium, preferably from about 15% to about 85% titanium and about 85% to about 15% zirconium.

The layer 21 can be deposited by conventional and well known vapor deposition techniques such as physical vapor deposition processes. The physical vapor deposition processes include reactive sputtering or reactive cathodic arc deposition. Reactive cathodic arc evaporation and reactive sputtering are generally similar to ordinary sputtering and cathodic arc evaporation except that a reactive gas is introduced into the chamber which reacts with the dislodged target material. Thus, in the case where zirconium nitride is the layer 21, the cathode is comprised of zirconium and nitrogen is the reactive gas introduced into the chamber. By controlling the amount of nitrogen available to react with the zirconium, the color of the zirconium nitride can be adjusted to be similar to that of brass of various hues.

In the case where zirconium carbonitride is the layer 21, the cathode is comprised of zirconium and nitrogen, methylene or acetylene are the reactive gases introduced into the chamber. The zirconium carbonitride, titanium carbonitride or zirconium/titanium alloy carbonitride give the appearance of black chrome.

Sputtering techniques and equipment are disclosed, inter alia, in J. Vossen and W. Kern "Thin film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

Layer 21 has a thickness which is at least effective to provide a decorative coating of a specific color. In the case of zirconium nitride it is a brass color. In the case of titanium nitride it is a gold color. In the case of zirconium carbonitride it has the appearance of black chrome. The thickness of layer 21 is also a thickness at least effective to provide abrasion and corrosion resistance to the underlying substrate. Generally this thickness is at least about 300 Angstroms, preferably at least about 2,000 Angstroms, and more preferably at least about 3,500 Angstroms. The upper thickness range is generally not critical but is controlled by secondary considerations such as cost and the like. Generally, however, a thickness above about 3 microns, preferably above about 2 microns, and more preferably above about 0.5 microns should not be exceeded.

In another embodiment of the instant invention a zirconium, titanium, or zirconium/titanium alloy strike layer is vapor deposited between the zirconium compound, titanium compound or zirconium/titanium alloy compound layer 21 and the polymeric layer 20. The strike layer functions, inter alia, to improve the adhesion of the layer 21 to the polymeric layer 20. The strike layer is comprised of the same metal or metal alloy as the metal compound layer 21. Thus if layer 21 is comprised of a zirconium compound such as zirconium nitride or zirconium carbonitride the strike layer is comprised of zirconium; if layer 21 is comprised of a titanium compound such as titanium nitride or titanium carbonitride the strike layer is comprised of titanium; and if layer 21 is comprised of zirconium/titanium alloy compound the strike layer is comprised of zirconium/titanium alloy.

The strike layer has a thickness at least effective to improve the adhesion of layer 21 to layer 20. Generally, this thickness is from about 30 Angstroms to about 1 micron, preferably from about 200 Angstroms to about 1 micron, and more preferably from about 350 Angstroms to about 0.25 microns.

The strike layer can be applied onto the polymeric layer 20 by conventional vapor deposition processes such as sputtering and cathodic arc evaporation.

In another embodiment of the instant invention layer 21, instead of being a monolithic layer comprised of zirconium compound, titanium compound or zirconium/titanium alloy compound, is a sandwich layer comprised of a plurality of alternating layers of zirconium compound, titanium compound, or zirconium/titanium alloy compound. Thus, for example, layer 21, instead of being comprised of zirconium compound, can be comprised of alternating layers of zirconium nitride and titanium nitride. The number of alternating zirconium compound and titanium compound layers can be from about 2 to about 10. Thus, for example, layer 21 can contain two zirconium nitride layers alternating with two titanium nitride layers, i.e., zirconium nitride layer/titanium nitride layer/zirconium nitride layer/titanium nitride layer. The total thickness of layer 21 is as set forth supra. The thickness of each individual zirconium compound or titanium compound layer is generally from about 30 Angstrom to about 1.5 microns, preferably from about 200 Angstroms to about 1 microns, and more preferably from about 350 Angstroms to about 0.25 microns.

Figure 2:
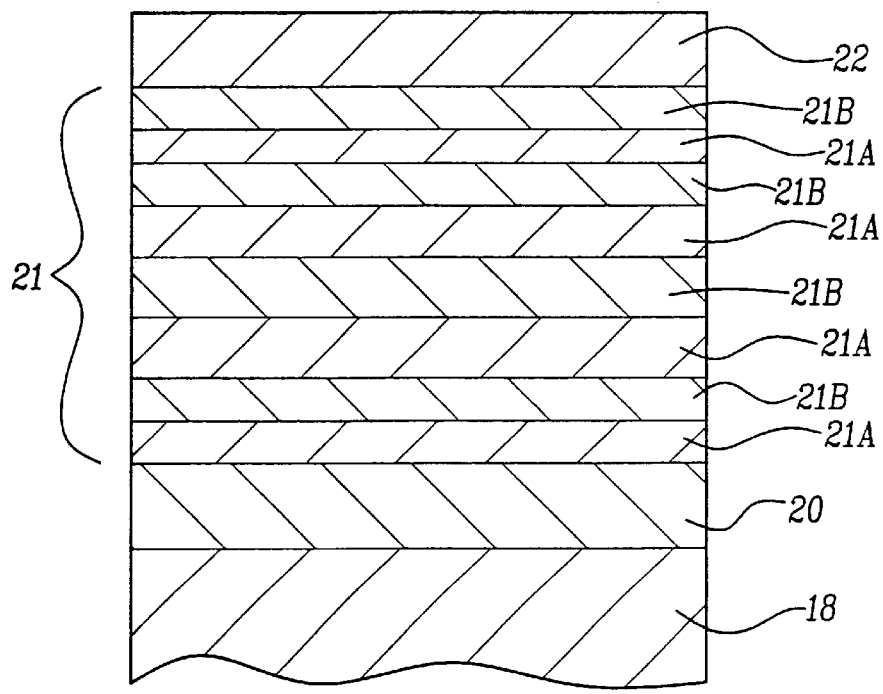
FIG. 2 is a cross-sectional view, not to scale, of a portion of the substrate showing another embodiment of the multi-layer coating.

FIG. 2 illustrates the embodiment where layer 21, instead of being monolithic, is a sandwich layer comprised of a plurality of alternating zirconium compound and layers 21A and titanium compound layers 21B. In FIG. 2 there are illustrated four zirconium compound layers 21A alternating with four titanium compound layers 21B.

The top coat 22 which is applied over the zirconium compound or titanium compound layer 21 should ideally be weather resistant, impact resistant, abrasion resistant, flexible, non-yellowing and transparent. The term "transparent" is defined as a coating through which the chrome layer can be seen. It is preferred that the transparent coating be substantially colorless so that the esthetic effects of layer 21 are not substantially decreased. However, in some instances the addition of color to the transparent layer can be esthetically beneficial. Polymeric or resinous coating material which exhibit good mixture of all of these properties are polyurethanes, polyacrylates, polymethacrylates, and blends and copolymers thereof. Of these polyurethanes are generally preferred as they exhibit a particularly good blend of all of these properties.

Polyurethanes are well known in the art and are readily commercially available. Various known polyols and polyisocyanates are used to form polyurethanes. Polyurethanes are useful as coatings and are described, for example, in Chapter X, Coatings, pp. 453–607 in J. H. Saunders and K. C. Frisch, Polyurethanes: Chemistry and Technology, Part II, Interscience Publishers (N.Y., 1964), incorporated herein by reference.

Suitable polyurethanes may be prepared in a conventional manner such as by reacting polyols or hydroxylated polymers with organic polyisocyanates in the manner well known in the art. Suitable organic polyisocyanates include, for instance, ethylene diisocyanate; ethylidene diisocyanate; propylene-1,2-diisocyanate; cyclohexylene-1,2-diisocyanate; m-phenylene diisocyanate; 2,4-toluene diisocyanate; 2,6-toluene diisocyanate; 3,3'-dimethyl-4,4'-diphenylene diisocyanate; p,p',p"-triphenylmethane triisoene diisocyanate; 3,3'-diphenyl-4,4'-biphenylene diisocyanate; 4,4'biphenylene diisocyanate; 3,3'-dichloro-4,4-biphenylene diisocyanate; p.p',p"-triphenylmethane triisocyanate; 1,5-mepthalene diisocyanate; furfurylidene diisocyanate or polyisocyanates, in a blocked or inactive form such as the bisphenyl carbamates of 2,4- or 2,6-toluene diisocyanate; p.p'-diphenyl methane diisocyanate; p-phenylene diisocyanate; 1,5-napthalene diisocyanate and the like. It is preferred to use a commercially available mixture of toluene diisocyanates which contains 80 percent 2,4-toluene diisocyanate and 20 percent 2,6-toluene diisocyanate or 4,4-diphenylmethane diisocyanate.

Polyurethanes applied as coatings in accordance with the invention may, of course, be in the form of solutions in suitable solvents such as xylene, toluene, methyl ethyl ketone, butanol, butyl acetate, etc.

Materials for the polyurethane coatings may be supplied in one package or two package prepolymer systems or oil modified systems, etc., all in the manner well known in the industry. Such materials are described for instance in the pamphlet "Urethane Coatings", published by the Federation of Societies for Paint Technology (1970). Radiation-curable urethane coatings may also of course be used.

Some illustrative examples of suitable polyurethane compositions are disclosed in U.S. Pat. Nos. 4,699,814; 4,681,811; 4,703,101; 4,403,003 and 5,268,215, all of which are incorporated herein by reference.

Another suitable type of polyurethane is an acrylic polyurethane. The acrylic polyurethanes are described in U.S. Pat. Nos. 3,558,564; 4,131,571 and 4,555,535, all of which are incorporated herein by reference.

The thickness of layer 22 is a thickness at least effective to protect the underlying zirconium compound or titanium compound layer. Generally this thickness is from about 0.05 mil to about 10 mils, preferably from about 0.1 mil to about 3 mils, and more preferably from about 0.3 mil to about 1.5 mils.

In order that the invention may be more readily understood the following example is provided. The example is illustrative and does not limit the invention thereto.

EXAMPLE 1

A steel substrate is ultrasonically cleaned and then heated at 250° F. to remove moisture. A basecoat polymeric composition is applied onto the cleaned and dried steel substrate by a standard and conventional high volume low pressure gun. The polymer is comprised of 35 weight percent styrenated acrylic resin, 30 weight percent melamine formaldehyde resin, and 35 weight percent bisphenol A epoxy resin. The polymer is dissolved in sufficient solvents to provide a polymeric composition containing about 43 weight percent solids. After the basecoat is applied onto the substrate the substrate is allowed to sit for 20 minutes for ambient solvent flash off. The substrate is then baked at 375° F. for 2 hours. The resulting cured polymeric basecoat has a thickness of about 0.8 mil.

The basecoated substrate is placed on a metallizing rack. The metallizing rack is placed in a metallizing carriage which is placed inside a vacuum chamber. The chamber is evacuated to a vacuum level of 5×10E−5 torr. About 800 standard cubic centimeters per minute of argon is introduced into the chamber. An electric arc is struck at the end of a zirconium/titanium alloy target. As the arc travels from the back end of the target to the front, its polarity is reversed, thereby causing the arc to move back and forth to evaporate the zirconium/titanium alloy target and deposit it on the basecoated substrate. A current of 500 amps is applied to the target. The deposition of the zirconium/titanium alloy continues for 9 minutes and a strike layer 1,000 Angstroms thick is deposited on the basecoat. After the strike layer has been deposited 800 standard cubic centimeters per minute of nitrogen are introduced into the chamber. This results in the deposition of zirconium/titanium alloy nitride onto the zirconium/titanium alloy strike layer. Deposition of zirconium/titanium alloy nitride is continued for 26 minutes. A layer of zirconium/titanium alloy nitride about 2,800 Angstroms thick, is deposited on the strike layer.

The gas flows and the arc current are turned off. The coated substrate is allowed to cool for 5 minutes and the chamber is vented. A topcoat composition is applied over the zirconium/titanium alloy nitride layer by a high volume low pressure gun. The topcoat composition contains a styrenated hydroxylated acrylic resin which is blended with hexamethylene diisocyanate to form an acrylated urethane. The topcoat composition contains 55 weight percent solids and 45 weight percent solvents. After the topcoat composition is applied, the substrate is allowed to sit at ambient temperature and pressure for about 20 minutes to allow the solvents to evaporate. The substrate is then baked at 160° one hour to cure the resinous topcoat. The cured acrylated urethane topcoat has a thickness of 1 mil.

The coated substrate has the appearance of gold and is resistant to abrasion and corrosion.

While certain embodiments of the invention have been described for purposes of illustration, it is to be understood that there may be other additional various embodiments and modifications within the general scope of the invention.

I claim:

1. An article having on at least a portion of its surface a multi-layer coating comprising:
   a layer comprised of polymeric material on at least a portion of the surface of said substrate;
   a color layer comprised of a compound selected from the group consisting of zirconium compound, titanium compound and zirconium/titanium alloy compound directly on said layer comprised of polymeric material; and a layer comprised of a polymeric material selected from the group consisting of polyurethane, polyacrylate or polymethacrylate on said layer comprised of zirconium compound, titanium compound or zirconium/titanium alloy compound.

2. The article of claim 1 wherein said compound is selected from a nitride, an oxide, a carbide, and a carbonitride.

3. The article of claim 2 wherein said compound is a nitride.

4. The article of claim 3 wherein said layer comprised of zirconium nitride, titanium nitride or zirconium/titanium alloy nitride is comprised of zirconium nitride.

5. The article of claim 3 wherein said layer comprised of zirconium nitride, titanium nitride or zirconium/titanium alloy nitride is comprised of titanium nitride.

6. The article of claim 2 wherein said compound is a carbonitride.

7. The article of claim 1 wherein said layer comprised of polyurethane, polyacrylate or polymethacrylate is comprised of polyurethane.

8. The article of claim 3 wherein said layer comprised of polyurethane, polyacrylate or polymethacrylate is comprised of polyurethane.

9. The article of claim 2 wherein said polymeric material is selected from the group consisting of polycarbonate, polyester, polymethacrylate, polystyrene, acrylonitrile-butadiene-styrene, styrene-acrylonitrile, alkyd resin, polyethylene, and blends and copolymers thereof.

10. An article having on at least a portion of its surface a multi-layer coating comprising:

a layer comprised of polymeric material on at least a portion of the surface of said substrate;

a layer comprised of zirconium, titanium or zirconium/titanium alloy on said layer comprised of polymeric material;

a color layer comprised of a compound selected from the group consisting of zirconium compound, titanium compound and zirconium/titanium alloy compound on said layer comprised of zirconium, titanium and zirconium/titanium alloy; and a layer comprised of a polymeric material selected from the group consisting of polyurethane, polyacrylate and polymethacrylate on said layer comprised of zirconium compound, titanium compound or zirconium/titanium alloy compound.

11. The article of claim 10 wherein said compound is selected from a nitride, an oxide, a carbide, and a carbonitride.

12. The article of claim 11 wherein said compound is a nitride.

13. The article of claim 12 wherein said layer comprised of zirconium nitride, titanium nitride or zirconium/titanium alloy nitride is comprised of zirconium nitride and said layer comprised of zirconium, titanium or zirconium/titanium alloy is comprised of zirconium.

14. The article of claim 12 wherein said layer comprised of zirconium nitride, titanium nitride or zirconium/titanium alloy nitride is comprised of titanium nitride and said layer comprised of zirconium, titanium or zirconium/titanium alloy is comprised of titanium.

15. The article of claim 11 wherein said compound is a carbonitride.

16. The article of claim 10 wherein said layer comprised of polyurethane, polyacrylate or polymethacrylate is comprised of polyurethane.

17. The article of claim 10 wherein said layer comprised of polyurethane, polyacrylate or polymethacrylate is comprised of polyurethane.

18. The article of claim 16 wherein said polymeric material is selected from the group consisting of polycarbonate, polyester, polymethacrylate, polystyrene, acrylonitrile-butadiene-styrene, styrene-acrylonitrile, alkyd resin, polyethylene, and blends and copolymers thereof.

19. The article of claim 10 wherein said article is comprised of metal.

20. The article of claim 19 wherein said article is a vehicle wheel cover.

21. The article of claim 10 wherein said article is comprised of metal alloy.

22. The article of claim 21 wherein said article is a vehicle wheel cover.

23. The article of claim 10 wherein said article is comprised of plastic.

24. The article of claim 23 wherein said article is a vehicle wheel cover.

25. An article having on at least a portion of its surface a multi-layer coating comprising:

a layer comprised of polymeric material on at least a portion of the surface of said substrate;

a sandwich layer comprised of alternating layers of compounds selected from the group consisting of zirconium compound, titanium compound and zirconium/titanium alloy compound directly on said layer comprised of polymeric material; and a layer comprised of a polymeric material selected from the group consisting of polyurethane, polyacrylate and polymethacrylate on said sandwich layer.

26. The article of claim 25 wherein said compound is selected from the group consisting of a nitride, an oxide, a carbide, and a carbonitride.

27. The article of claim 26 wherein said compound is a nitride.

28. The article of claim 27 wherein said sandwich layer is comprised of alternating layers comprised of zirconium nitride and titanium nitride.

29. The article of claim 26 wherein said compound is a carbonitride.

30. The article of claim 25 wherein said layer comprised of a polymeric material selected from the group consisting of polyurethane, polyacrylate and polymethacrylate is comprised of polyurethane.

31. The article of claim 25 wherein said polymeric material is selected from the group consisting of polycarbonate, polyester, polymethacrylate, polystyrene, acrylonitrile-butadiene-styrene, styrene-acrylonitrile, alkyd resin, polyethylene, and blends and copolymers thereof.

32. The article of claim 25 wherein a layer comprised of zirconium, titanium or zirconium/titanium alloy is disposed intermediate said layer comprised of polymeric material and said sandwich layer.

33. The article of claim 32 wherein said compound is selected from the group consisting of a nitride, an oxide, a carbide and a carbonitride.

34. The article of claim 33 wherein said compound is a nitride.

35. The article of claim 34 wherein said sandwich layer is comprised of alternating layers comprised of compounds selected from the group consisting of zirconium nitride and titanium nitride.

36. The article of claim 33 wherein said compound is a carbonitride.

37. The article of claim 32 wherein said layer comprised of a polymeric material selected from the group consisting of polyurethane, polyacrylate and polymethacrylate is comprised of polyurethane.

38. The article of claim 32 wherein said polymeric material is selected from the group consisting of polycarbonate, polyester, polymethacrylate, polystyrene, acrylonitrile-butadiene-styrene, styrene-acrylonitrile, alkyd resin, polyethylene, and blends and copolymers thereof.

* * * * *